United States Patent
Cutter

(10) Patent No.: US 7,843,259 B2
(45) Date of Patent: Nov. 30, 2010

(54) FIELD EFFECT TRANSISTOR CIRCUIT AND METHOD OF OPERATION OF FIELD EFFECT TRANSISTOR CIRCUIT FOR REDUCING THERMAL RUNAWAY

(75) Inventor: John R. Cutter, Macclesfield (GB)

(73) Assignee: NXP B.V., Eindhoven (NL)

( * ) Notice: Subject to any disclaimer, the term of this patent is extended or adjusted under 35 U.S.C. 154(b) by 312 days.

(21) Appl. No.: 11/658,224

(22) PCT Filed: Jul. 18, 2005

(86) PCT No.: PCT/IB2005/052389

§ 371 (c)(1),
(2), (4) Date: Mar. 9, 2009

(87) PCT Pub. No.: WO2006/011111

PCT Pub. Date: Feb. 2, 2006

(65) Prior Publication Data

US 2009/0212846 A1     Aug. 27, 2009

(30) Foreign Application Priority Data

Jul. 20, 2004    (GB)  ................................. 0416174.1

(51) Int. Cl.
*H01L 25/00*      (2006.01)
(52) U.S. Cl. ........................ 327/564; 327/565; 327/566; 257/365; 257/366
(58) Field of Classification Search ......... 327/564–566; 257/365, 366
See application file for complete search history.

(56) References Cited

U.S. PATENT DOCUMENTS

| | | | | |
|---|---|---|---|---|
| 5,493,244 A | * | 2/1996 | Pathak et al. | 327/313 |
| 5,748,025 A | * | 5/1998 | Ng et al. | 327/333 |
| 5,892,371 A | * | 4/1999 | Maley | 326/81 |
| 6,767,779 B2 | * | 7/2004 | Parker et al. | 438/204 |
| 6,987,412 B2 | * | 1/2006 | Sutherland et al. | 327/333 |
| 2004/0113179 A1 | | 6/2004 | Pfirsch et al. | |

* cited by examiner

*Primary Examiner*—Kenneth B. Wells

(57) ABSTRACT

A field transistor is divided into a number of cells (6) and includes a separate first gate line (20) connected to first transistor cells (8) and a separate second gate line (22) connected to second transistor cells (10). A drive circuit is used to drive all the cells (6) in a normal, saturated operations state but to drive only the second cells (10) in a linear operations state to reduce the number of cells used in the linear operations state.

11 Claims, 2 Drawing Sheets

FIELD EFFECT TRANSISTOR CIRCUIT AND METHOD OF OPERATION OF FIELD EFFECT TRANSISTOR CIRCUIT FOR REDUCING THERMAL RUNAWAY

The invention relates to insulated gate field effect transistors and methods of using them.

Power metal oxide semiconductor field effect transistors (MOSFETs) are generally used as switches in which they are either fully on or fully off. However, MOSFETs can also be used in a linear region of operation to self-protect the MOSFET from over-voltage spikes by turning on and absorbing power as part of a linear region of operation, typically using a dynamic clamp circuit, or to limit the current for a short period of time long enough for a decision to be made to switch the current to a safe state.

Other circuits also require operation in the linear mode. For example, many simple motors are controlled in this way, such as fan motors.

A problem occurs when modem power MOSFETs, especially trench MOSFETs and vertical double diffused MOSFETS (VDMOS), are operated in the linear regime. Modern devices typically have small cell pitches (<10 μm) and these devices are susceptible to thermal runaway.

The reason for the thermal runaway in small devices is the existence of a critical current density $J_c$ above which the current density decreases with increasing temperature but below which the current density increases with increasing temperature. If a FET is operated below the critical current density $J_c$ a small increase in temperature increases current density, which causes an increase in temperature, causing still higher current density, i.e. thermal runaway.

The value of the critical current density $J_c$ is determined by two competing effects. Firstly, as temperature increases the resistance of the channel increases. This decreases current density with increasing temperature. Secondly, as temperature increases, the threshold voltage of the MOSFET decreases. This change in threshold voltage does not matter when the MOSFET is switched hard on. However, in the linear regime, the decreased threshold voltage changes the effective gate voltage thereby increasing current density with increasing temperature. As the gain increases, the second effect becomes relatively more important. Modern MOSFETs have high values of gate width per unit area and are operated at currents such that the second effect is dominant, i.e. the MOSFETs are operated below $J_c$.

This means that modem power MOSFETs are susceptible to thermal runaway which can in turn lead to device failure.

As will be appreciated by the skilled person the problem is not limited to devices using oxide on silicon, but can occur in any power FET.

There is accordingly a need for a design of FET in which this problem is alleviated.

According to the invention there is provided an insulated gate field effect transistor according to claim 1.

By connecting the cells in this way it is possible to drive the device so that only the second cells but not the first cells operate when the FET is used in a linear operation state. The current then passes only through the second cells. The current density is accordingly higher. In this way, the FET can operate either above the critical current density $J_c$ or closer to it, but below, reducing the likelihood of thermal runaway.

Although the inventor is aware of a prior art document with multiple types of cells, namely US2003/0230766 A1, in that document all the cells appear to be connected in parallel, whereas this invention uses cells driven separately via separate gate lines.

Preferably, all of the cells are substantially identical.

This invention may be incorporated into discrete MOSFETs or the power section of an IC.

In a preferred embodiment the cells are in the form of parallel stripes, and the second cells are interdigitated with the first cells.

A particularly convenient arrangement has a gate pattern in which the first gate line extends laterally across the stripes and is connected to a plurality of first gate fingers extending longitudinally along the stripes to connect to the gates of the first cells; and the second gate line extends laterally across the stripes and has a plurality of second gate fingers extending longitudinally along the stripes to connect to the gates of the second cells.

In a preferred embodiment the second gate line extends along the middle of the gate pattern and the first gate line extends around the periphery of the gate pattern.

In particularly preferred arrangements, there is provided at least one drive circuit element for driving only the second cells in a linear operation state. Generally, all of the cells will be driven in a saturated operation state.

The complete drive circuit may be separate or partly or fully realised on the MOSFET chip. Thus, there may be one or more drive circuit elements integrated on the chip and these may be only part, or all, of the full drive circuit.

Those skilled in the art of manufacturing power MOSFETs will realize that these components are easily fabricated in the gate metallisation which may be polysilicon. In alternative arrangements more complex or different circuitry is connected to the linear operation contact, for example an external voltage clamp circuit.

Preferably, the second cells are uniformly distributed amongst the first cells, so that any rise in temperature caused by current in these cells is likewise distributed.

The cells may be stripes. It is particularly easy to connect stripes in two groups, since all cells can be connected at the ends of the stripes. Further, the gates of stripes can be connected as required using only a single layer of gate metallisation.

Alternatively, square, hexagonal or any shape of cells may be used.

In preferred embodiments, the number of second cells required is in the range from 1% to 50% of the total number of cells. The smaller the cell pitch the more extreme the ratio required to restore a positive temperature coefficient.

The invention also, in another aspect, relates to a method of operation of the above field effect transistor. The method includes driving the field effect transistor in a normal operation state by driving all of the gates of all of the cells to switch the cells on; and driving the field effect transistor in a linear operations state in which the transistors are not fully turned on, by driving the second cells to be in a linear operation condition but leaving the first cells turned off.

For a better understanding of the invention an embodiment will be described, purely by way of example, with reference to the accompanying drawings in which.

Figure 1:
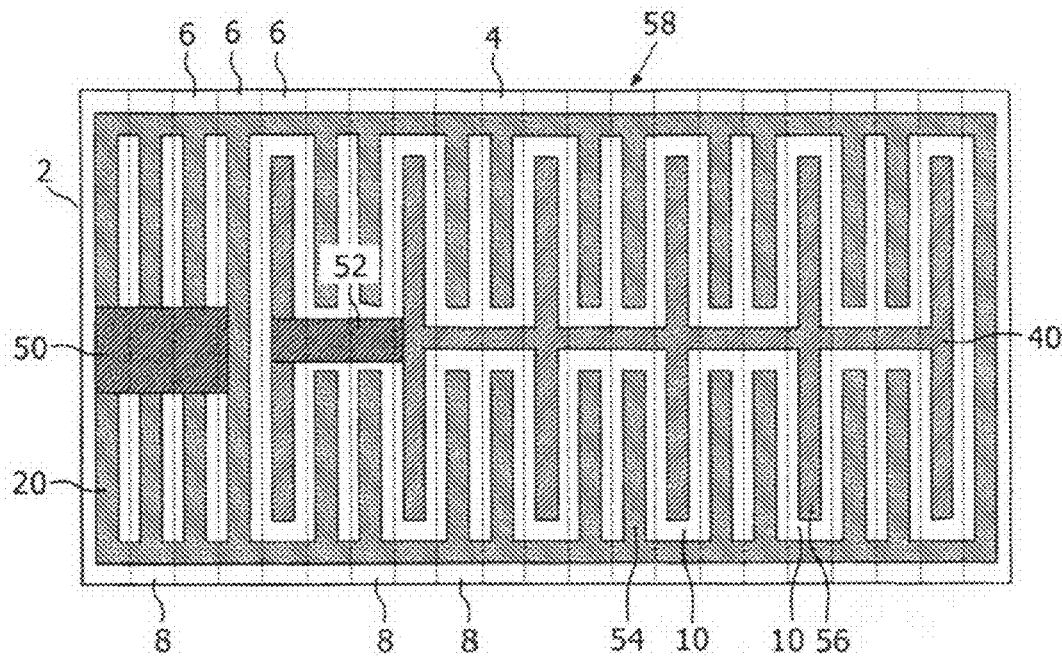
FIG. 1 shows a top view of a field effect transistor according to a first embodiment of the invention.

An example of a possible layout is given in FIG. 1. This includes a separate gate bond pad so that each part of the FET can be driven separately.

Referring to FIG. 1, a semiconductor substrate 2 has a first major surface 4 as its upper surface. A plurality of cells 6 are defined in stripes on the first major surface 4. The cells 6 are divided into normal cells 8 and linear operation cells 10, shown divided by dotted lines.

Figure 2:
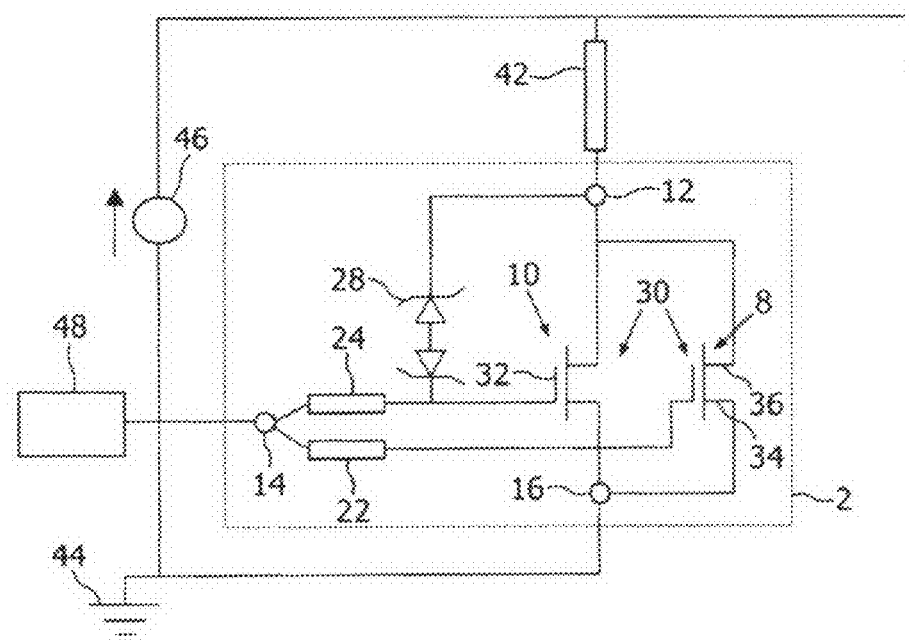
FIG. 2 shows a circuit diagram of the field effect transistor according to a second embodiment of the invention.
Figure 3:
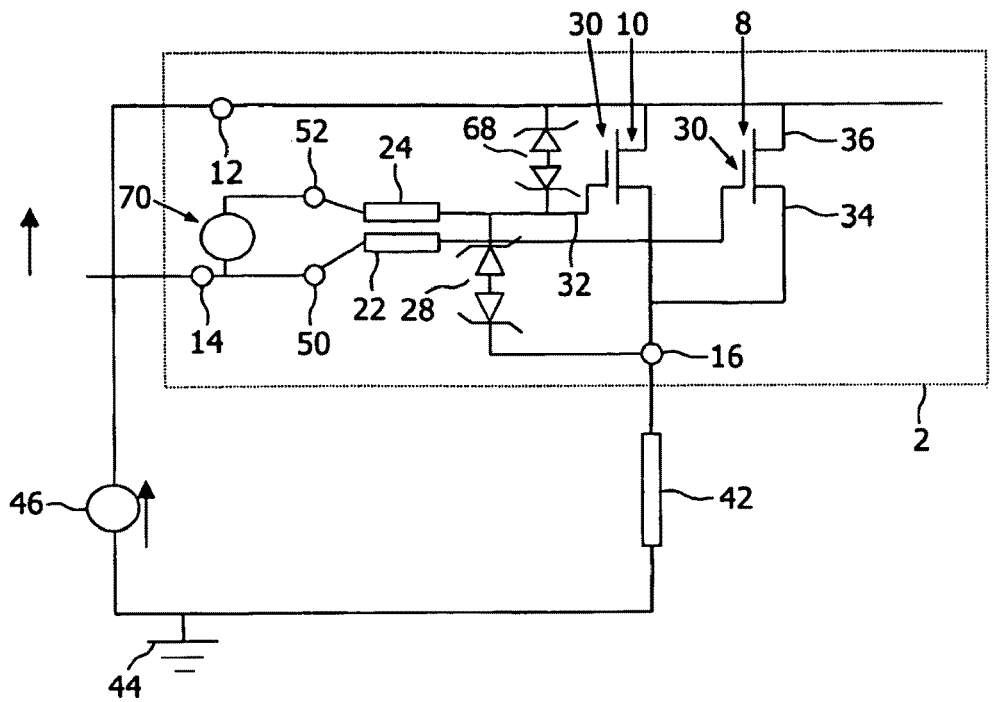
FIG. 3 shows a circuit diagram of the field effect transistor according to a third embodiment of the invention.

Each cell 6 contains a field effect transistor with gate 32, source 34 and drain 36 (FIGS. 2, 3). The first cells 8 are substantially identical to the second cells 10 in the semiconductor body and are distinguished by their gate connections as shown in FIG. 1. It will be appreciated by those skilled in the art that rear drain connections and front source connections are also to be supplied to all cells. For clarity, these are not shown in FIG. 1.

The gates of the cells form a gate pattern 58 in the gate metallisation. A first gate pad 50 is connected via first gate line 20 to connect to the gates of the first cells 8. A second gate pad 52 is connected via second gate line 40 to the gates of the second cells 10. It will be noted from the figure that the second gate line 40 extends down the centre of the gate pattern 58 having second gate fingers 56 extending from the second gate line 40 towards the edges of the gate pattern 58. The first gate line 20 extends around the periphery of the gate pattern 58 and has first gate fingers 54 extending towards the centre of the gate pattern 58 from the first gate line 20. The second gate fingers 56 are interdigitated with the first gate fingers 54.

Those skilled in the art will appreciate that the interdigitated gate pattern 58 of FIG. 1 may be repeated multiple times over on a substrate.

A drive circuit, not shown in FIG. 1, may be used to drive the first and second gate lines 20,40 and hence the gates 32 of the first and second cells 6. The drive circuit may be used to drive only the second cells 10 in a linear operations state and all the cells 6 in a normal, saturated operations state. The drive circuit may be external or internal.

In the linear operation mode of operation, only the second cells 10 are used. The current density in these cells is therefore much higher than it would be if all cells were used. This increased current density may be arranged to be above the critical current density $J_c$ and so the temperature coefficient is negative not positive. In this way thermal runaway is avoided. Alternatively, the thermal runaway effect may be reduced even if the critical current density is not achieved.

By distributing the second cells 10 evenly over the first major surface 4, the rise in temperature of the complete device is even thereby avoiding problems with hotspots.

Embodiments including internal drive circuits will now be described. They can use the same gate pattern as FIG. 1, with gate pads 50, 52 connected to different circuits to achieve the required operation.

In FIG. 2 an example is given of how to use the device in a low side circuit with inductive load 42 and a dynamic clamp. In the specific low side switch arrangement shown in FIG. 2, an integrated circuit on a single substrate 2 is represented by the components within the dotted line.

A single external gate contact 14 is connected to the two gates via first and second resistors 22 and 24 connected to the first and second gate lines 20, 40 respectively. The first and second resistors 22, 24 have resistances in inverse ratio to the number of first 8 and second 10 cells respectively in order to keep the RC time constant of each part of the circuit the same.

A common drain contact 12 is connected to the rear of the substrate and hence to the drain 36 of each field effect transistor 30 in parallel.

A common source contact 16 is connected to the sources 34 of each field effect transistor 30 in parallel.

A circuit element 28, in this example comprising back to back zener diodes, is connected between the second gate line 40 and a common drain 12 to form a dynamic clamp.

In use, as shown in FIG. 2, voltage source 46 is connected to the common source contact 16 and through inductive load 42 to the common drain contact 12. The circuit is thus a low side switch. A gate drive circuit 48 is connected to the external gate contact 14.

In normal operation the transistors 30 are fully turned on and all cells 6 operate.

However, when the gate is turned off the inductive load 42 forces drain 12 positive. When the breakdown voltage of the zener diodes 28 is exceeded the gates of the second cells are held at a voltage leaving the second cells 10 in a state in which they are on but not saturated, i.e. in a linear operation state while the first cells 8 turn off. The energy in the inductive load 42 then dissipates in the second cells 10. The second cells 10 have a high current density avoiding thermal runaway whilst the spread of second cells 10 over the device avoids current crowding and spreads the heat generated evenly over the device.

FIG. 3 shows a third embodiment, in this case a high side switch suitable for linear operation. Like components are given the same reference numerals as in FIG. 2, and the description of similar components will not be repeated.

In this embodiment a single external gate contact 14 is connected to a gate drive circuit 70 connected to drive first gate pad 50 and second gate pad 52 with a voltage of 0.5V to 1V between the two gate pads 50,52. Accordingly, the second cells 10 turn on first and take most of the current until the MOSFET is in saturation. Then as the gate is overdriven all the MOSFET area comes into use and the resistance at 10 volts gate is within a few percent of the optimum value. This embodiment is particularly useful in a current limiting application.

Figure 4:
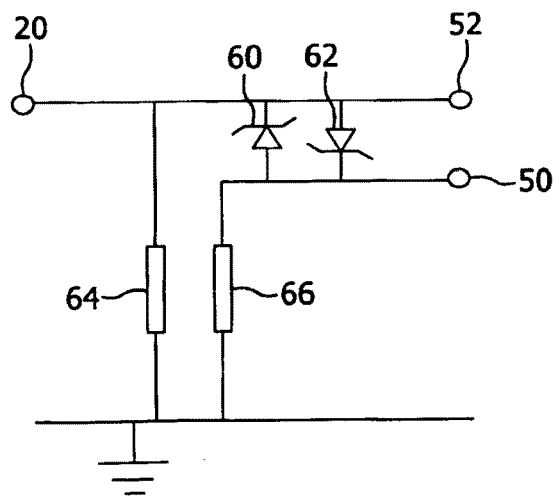
FIG. 4 shows a detail of the third embodiment of the invention.

FIG. 4 shows a suitable gate drive circuit 70 which can be easily incorporated onto the power MOSFET chip 2. External gate contact 14 is connected to ground 44 through resistor 64 and also directly to second gate contact pad 52. A pair of Zener diodes 60, 62 are connected in parallel in opposite polarity between the second gate contact pad 52 and the first gate contact pad 50. Resistor 66 connects the first gate contact pad to ground.

The invention can be used wherever power FETs are used in the linear mode. For example, in a motor control circuit, a separate gate contact can be used for the linear operation cell gates, and only that contact connected into the control loop to drive the motor. Only when it is required to turn the power FETs fully on are the normal cells switched on.

From reading the present disclosure, other variations and modifications will be apparent to persons skilled in the art. Such variations and modifications may involve equivalent and other features which are already known in the design, manufacture and use of semiconductor devices and circuits and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A field effect transistor circuit, comprising;
a semiconductor substrate having a first major surface;
a plurality of transistor cells arranged across the substrate, each transistor cell including a FET having an insulated gate, a source and a drain;
wherein the transistor cells are divided into first cells and second cells, there being more first cells than second cells;
a first gate line connected to the first cells and a separate second gate line connected to the second cells; and
a means for driving the second gate line separately from the first gate line for turning on only the FETs of the second cells in a linear operation state.

2. A field effect transistor circuit according to claim 1, wherein the transistor cells are parallel stripes, and the second cells are interdigitated with the first cells.

3. A field effect transistor circuit according to claim 2, further comprising a gate pattern in which the first gate line extends laterally across the stripes and is connected to a plurality of first gate fingers extending longitudinally along the stripes to connect to the gates of the first cells and the second gate line extends laterally across the stripes and has a plurality of second gate fingers extending longitudinally along the stripes to connect to the gates of the second cells.

4. A field effect transistor circuit according to claim 3 wherein the second gate line extends along the middle of the gate pattern and wherein the first gate line extends around the periphery of the gate pattern.

5. A field effect transistor circuit according to claim 1 comprising a first gate pad connected to the first gate line and a separate second gate pad connected to the second gate line.

6. A field effect transistor circuit according to claim 1, wherein the second cells are substantially evenly distributed over the first major surface.

7. A field effect transistor circuit according to claim 1, further comprising at least one circuit element arranged to drive the first and second gate lines to different voltages in a linear operation state to switch the second cells and not the first cells on in the linear operation state.

8. A field effect transistor circuit according to claim 7, wherein the at least one circuit element includes a voltage clamp circuit connected to the second gate line and hence to the gates of the second cells but not the first cells.

9. A field effect transistor circuit according to claim 8, wherein the voltage clamp circuit is connected between the second gate line and the drain of the transistors included in the second cells.

10. A field effect transistor circuit according to claim 1, wherein the number of second cells is from 1% to 50% of the total number of cells.

11. A method of operation of a field effect transistor circuit including a semiconductor substrate defining a first major surface; a plurality of transistor cells arranged across the substrate, each transistor cell including a FET having an insulated gate, a source and a drain wherein the cells are divided into first cells and second cells, there being more first cells than second cells, the method including:

driving the field effect transistor circuit in a saturated operation state by driving all of the gates of all of the FETs to switch the transistor cells on; and driving the field effect transistor circuit in a linear operation state in which the FETs of the transistor cells are not fully turned on, by driving the second cells to be in a linear operation condition but leaving the first cells turned off.

* * * * *